(12) United States Patent
Wang et al.

(10) Patent No.: US 12,716,658 B2
(45) Date of Patent: Aug. 25, 2026

(54) VAPOR CHAMBER

(71) Applicant: PURPLE CLOUD DEVELOPMENT PTE. LTD., Singapore (SG)

(72) Inventors: Xue Mei Wang, Hui Zhou City (CN); Xiao Min Zhang, Hui Zhou City (CN); Xiong Zhang, Hui Zhou City (CN)

(73) Assignee: PURPLE CLOUD DEVELOPMENT PTE. LTD., Singapore (SG)

(*) Notice: Subject to any disclaimer, the term of this patent is extended or adjusted under 35 U.S.C. 154(b) by 250 days.

(21) Appl. No.: 17/958,636

(22) Filed: Oct. 3, 2022

(65) Prior Publication Data

US 2023/0417491 A1 Dec. 28, 2023

(30) Foreign Application Priority Data

Jun. 23, 2022 (CN) ........................ 202210726117.2

(51) Int. Cl.
*F28D 15/04* (2006.01)
*F28D 15/02* (2006.01)
*H05K 7/20* (2006.01)

(52) U.S. Cl.
CPC ....... *F28D 15/046* (2013.01); *F28D 15/0266* (2013.01); *F28D 15/0233* (2013.01); *H05K 7/20336* (2013.01)

(58) Field of Classification Search
CPC ............ H05K 7/20336; F28D 15/0233; F28D 15/046
See application file for complete search history.

(56) References Cited

U.S. PATENT DOCUMENTS 6,263,959 B1 * 7/2001 Ikeda .................. F28D 15/0233 165/104.33
6,317,322 B1 * 11/2001 Ueki ..................... H01L 23/427 361/698
10,018,427 B2 * 7/2018 Lin ....................... H01L 23/427
(Continued)

FOREIGN PATENT DOCUMENTS

CN 105865241 B * 7/2018 ........... F28D 15/046
CN 108302968 B * 5/2020 ............. F28D 15/04
TW I454651 B * 10/2014

OTHER PUBLICATIONS

Translation of TWI454651B named Translation-TWI454651B (Year: 2014).*

(Continued)

*Primary Examiner* — Paul Alvare
(74) *Attorney, Agent, or Firm* — Merchant & Gould P.C.

(57) ABSTRACT

A vapor chamber includes a first cover and a second cover. The first cover has a thermal contact surface. The thermal contact surface is configured to be thermally coupled to a heat source. The second cover and the first cover are joined together to form an air tight space. The air tight space is configured to accommodate a cooling fluid. The thermal contact surface faces away from the air tight space. The second cover has a first surface, a second surface and at least one first support protrusion structure. The first surface faces away from the first cover. The second surface faces the first cover. The at least one first support protrusion structure protrudes from the second surface of the second cover and is in physical contact with the first cover.

11 Claims, 6 Drawing Sheets

(56) References Cited

U.S. PATENT DOCUMENTS

2002/0007555 A1* 1/2002 Ikeda ...................... F28D 15/06
29/890.032
2009/0025910 A1* 1/2009 Hoffman ............... F28D 15/046
165/104.21
2010/0071879 A1* 3/2010 Hou ...................... F28D 15/046
29/890.032
2011/0232877 A1* 9/2011 Meyer, IV ............ F28D 15/046
165/104.33
2013/0025829 A1* 1/2013 Huang ................ F28D 15/0233
165/104.26
2015/0027668 A1* 1/2015 Yang .................. H05K 7/20336
165/104.21
2016/0219756 A1* 7/2016 Sun ........................... F28F 1/26
2017/0122672 A1* 5/2017 Lin ........................ B23K 35/00
2018/0066897 A1* 3/2018 Lin .................... H05K 7/20336
2018/0288901 A1* 10/2018 Huang .................. H01L 23/427
2018/0292145 A1* 10/2018 Sun ..................... F28D 15/0275
2018/0372419 A1* 12/2018 Liu ..................... F28D 15/0275
2019/0226770 A1* 7/2019 Cheng ....................... F28F 3/12
2019/0376747 A1* 12/2019 Cheng ..................... F28F 3/046
2020/0003499 A1* 1/2020 Kume ................... F28D 15/046
2020/0200484 A1* 6/2020 Zhou ................... F28D 15/0283
2020/0355444 A1* 11/2020 Chen ................... F28D 15/0283
2022/0028754 A1* 1/2022 Bullema ............... H01L 23/427

OTHER PUBLICATIONS

Translation of CN108302968B named Translation-CN108302968B (Year: 2020).*

Translation of CN105865241B named Translation-CN105865241B (Year: 2018).*

* cited by examiner

VAPOR CHAMBER

CROSS-REFERENCE TO RELATED APPLICATIONS

This non-provisional application claims priority under 35 U.S.C. § 119(a) on Patent Application No(s). 202210726117.2 filed in China, on Jun. 23, 2022, the entire contents of which are hereby incorporated by reference.

TECHNICAL FIELD

The disclosure relates to a heat spreader, more particularly to a vapor chamber.

BACKGROUND

The technical principle of vapor chamber is similar to that of heat pipe, but there are differences therebetween in the way of conduction. The heat pipe only transfers heat in one dimension, while the vapor chamber transfers heat in two dimensions, so the efficiency of heat dissipation of the vapor chamber is better. Specifically, the vapor chamber mainly includes a chamber and a capillary structure. The chamber has an interior space configured for accommodating a working fluid. The capillary structure is disposed in the interior space. A heated part of the chamber is called an evaporation portion. A dissipation part of the chamber is called a condensation portion. The working fluid absorbs heat in the evaporation portion and vaporizes and rapidly spreads all over the interior space. The vaporized working fluid releases heat and condenses into liquid form in the condensation portion and return to the evaporation portion via the capillary structure so as to complete a cooling cycle.

Conventionally, there are a plurality of support pillars disposed in the chamber of the vapor chamber so as to increase the structural strength of the chamber by the support provided by the support pillars. However, the conventional way of disposing support pillars is to manually place the support pillars on the plate of the chamber, and then fix these support pillars to the plate of the chamber by a welding process. Therefore, the conventional way of disposing support pillars in the chamber is difficult in manual placement.

SUMMARY

The disclosure provides a vapor chamber which is configured such that the procedure of manually placing support pillars in the chamber of the vapor chamber can be omitted.

One embodiment of the disclosure provides a vapor chamber including a first cover and a second cover. The first cover has a thermal contact surface. The thermal contact surface is configured to be thermally coupled to a heat source. The second cover and the first cover are joined together to form an air tight space. The air tight space is configured to accommodate a cooling fluid. The thermal contact surface faces away from the air tight space. The second cover has a first surface, a second surface and at least one first support protrusion structure. The first surface faces away from the first cover. The second surface faces the first cover. The at least one first support protrusion structure protrudes from the second surface of the second cover and is in physical contact with the first cover.

Another embodiment of the disclosure provides a vapor chamber including a first cover and a second cover. The first cover has a thermally conductive protrusion structure. The thermally conductive protrusion structure is configured to be thermally coupled to a heat source. The second cover and the first cover are joined together to form an air tight space. The air tight space is configured to accommodate a cooling fluid. The second cover has at least one first support protrusion structure. The at least one first support protrusion structure and the thermally conductive protrusion structure protrude in a same direction, and the at least one first support protrusion structure is in physical contact with the first cover.

Another embodiment of the disclosure provides a vapor chamber including a first cover and a second cover. The first cover has a thermal contact surface. The thermal contact surface is configured to be thermally coupled to a heat source. The second cover and the first cover are joined together to form an air tight space. The air tight space is configured to accommodate a cooling fluid. The thermal contact surface faces away from the air tight space. The first cover has at least one first support protrusion structure. The at least one first support protrusion structure protrudes from the first cover and is in physical contact with the second cover.

According to the vapor chamber as described above, the at least one first support protrusion structure is formed by, for example, a sheet metal stamping process. Therefore, the procedure of manually placing supporting pillars can be omitted, thereby solving the problem of difficult to manually placing support pillars in the manufacturing procedure of the conventional vapor chamber.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
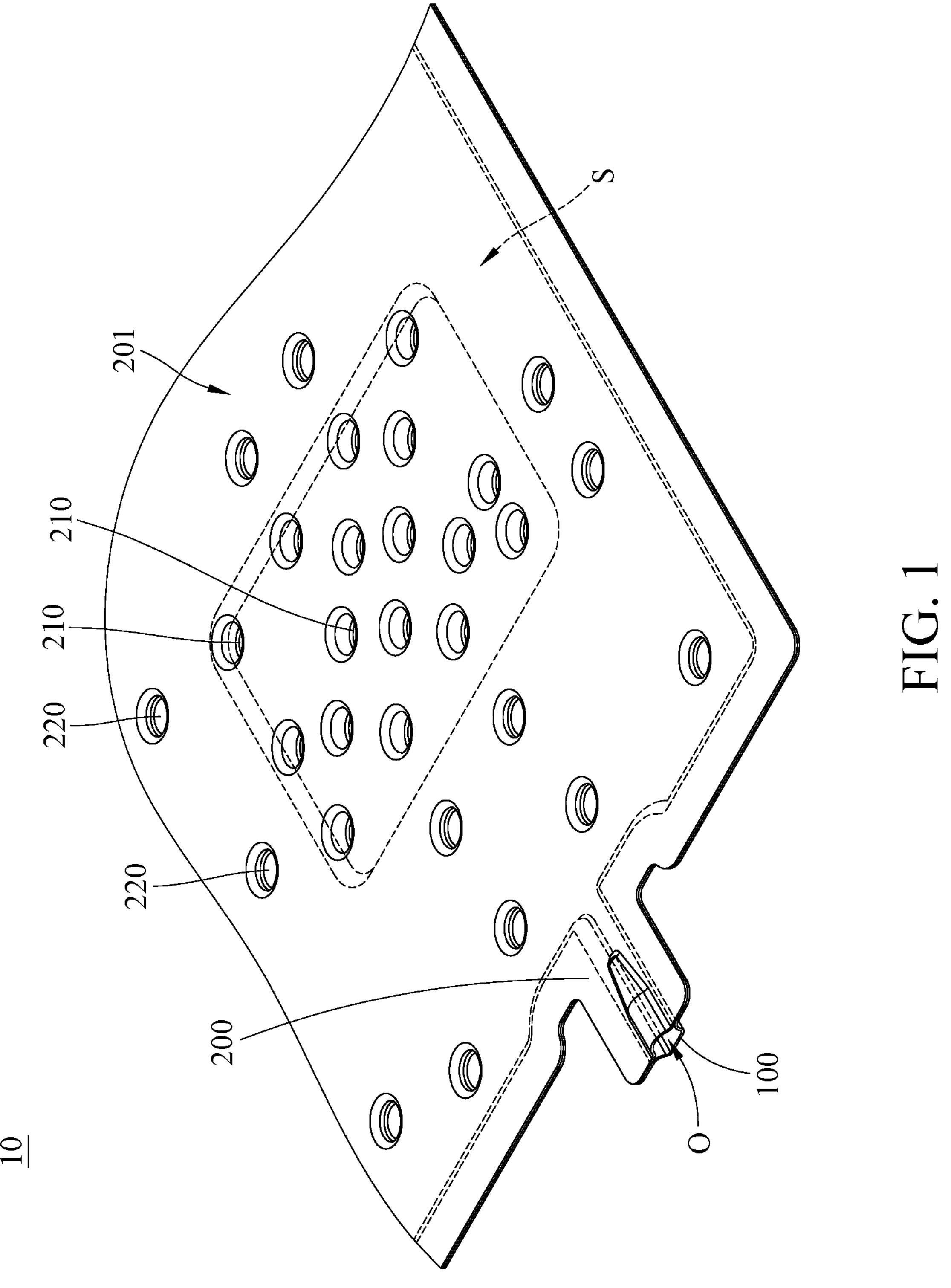
FIG. 1 is a perspective view of a vapor chamber in accordance with the first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Please refer to FIG. 1, which is a perspective view of a vapor chamber 10 in accordance with the first embodiment of the disclosure.

In this embodiment, the vapor chamber 10 includes a first cover 100 and a second cover 200. The second cover 200 and the first cover 100 are joined together to form an air tight space S. The air tight space S is configured to accommodate a cooling fluid. In addition, the vapor chamber 10 may further have a charge and deaeration opening O. When the vapor chamber 10 is being charged with gas or being deaerated, the charge and deaeration opening O is in fluid communication with the air tight space S. On the other hand, after the gas charging and deaerating procedure to the vapor chamber 10 is completed, a pressing procedure is performed so that the charge and deaeration opening O and the air tight space S are not in fluid communication with each other.

Figure 2:
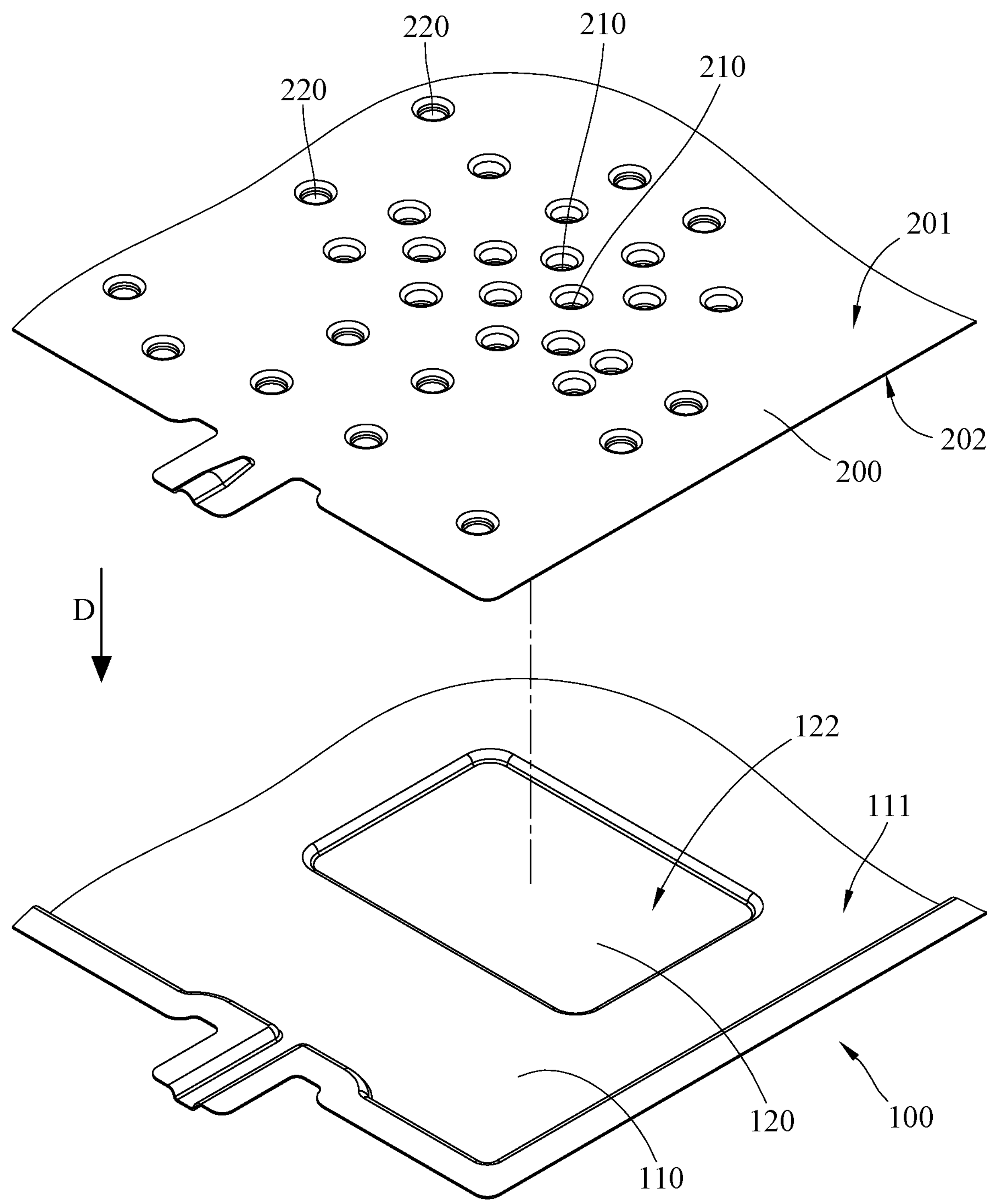
FIG. 2 is an exploded view of the vapor chamber in FIG. 1.
Figure 3:
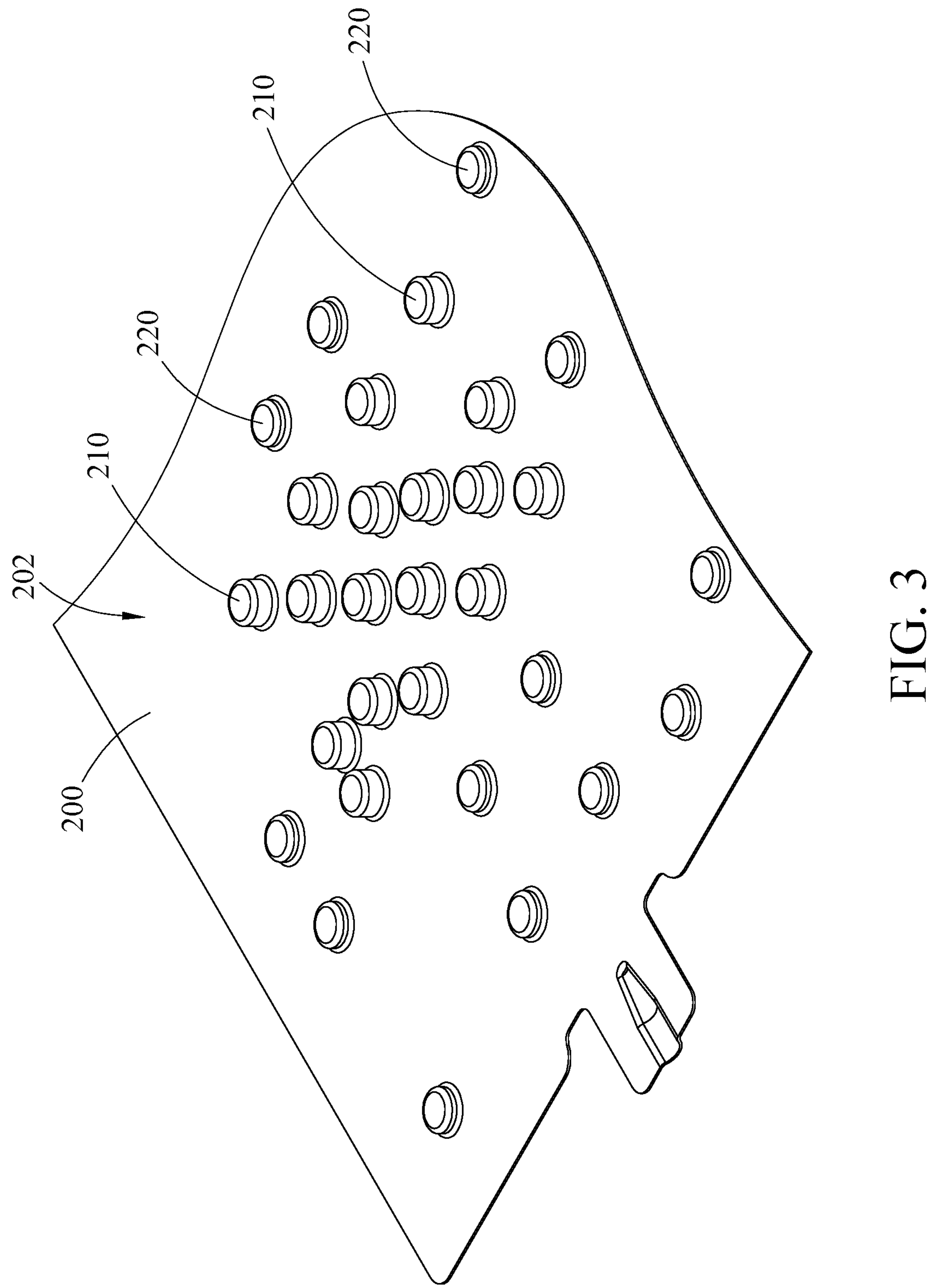
FIG. 3 is a perspective view of a second cover in FIG. 2.
Figure 4:
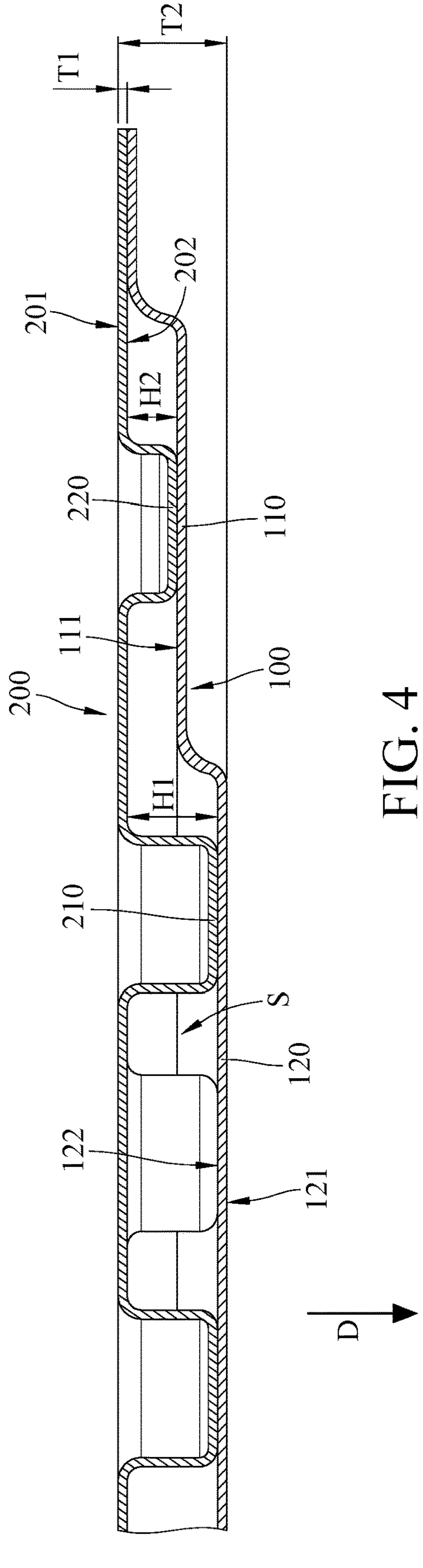
FIG. 4 is a cross-sectional view of the vapor chamber in FIG. 1.

Please refer to FIG. 2 to FIG. 4, where FIG. 2 is an exploded view of the vapor chamber in FIG. 1, FIG. 3 is a perspective view of a second cover in FIG. 2, and FIG. 4 is a cross-sectional view of the vapor chamber in FIG. 1. The first cover 100 includes a plate 110 and a thermally conductive protrusion structure 120. The thermally conductive protrusion structure 120 protrudes from the plate 110 in a direction away from the air tight space S. The thermally conductive protrusion structure 120 has a thermal contact surface 121, and the thermal contact surface 121 is located at a side of the thermally conductive protrusion structure 120 located away from the air tight space S. That is, the thermal contact surface 121 faces away from the air tight space S. The thermal contact surface 121 is configured to be thermally coupled to a heat source (not shown) to dissipate heat from the heat source. The heat source is, for example, a central processing unit or a graphics processing unit. In addition, the plate 110 has a first inner surface 111, and the thermally conductive protrusion structure 120 has a second inner surface 122. There is a step formed between the first inner surface 111 and the second inner surface 122, and both the first inner surface 111 and the second inner surface 122 face the second cover 200.

The second cover 200 has a first surface 201, a second surface 202 and a plurality of first support protrusion structures 210. The first surface 201 faces away from the first cover 100. The second surface 202 faces the first cover 100. The first support protrusion structures 210 protrude from the second surface 202 of the second cover 200 and are in physical contact with the first cover 100.

In this embodiment, the second cover 200 may further have a plurality of second support protrusion structures 220. The second support protrusion structures 220 protrude from the second surface 202 of the second cover 200 and are in physical contact the plate 110, and a height H1 of the first supporting protrusion structures 210 protruding from the second surface 202 is larger than a height H2 of the second supporting protrusion structures 220 protruding from the second surface 202. The heights H1 and H2 of the first support protrusion structures 210 and the second supporting protrusion structures 220 protruding from the second surface 202 are, for example, less than or equal to 6 times of a thickness T1 of the second cover 200, or, for example, it is larger than or equal to 30% of a thickness T2 of the vapor chamber 10, and less than or equal to 90% of the thickness T2 of the vapor chamber 10.

In this embodiment, the first supporting protrusion structures 210 and the second support protrusion structures 220 are formed by, for example, a sheet metal stamping process. Therefore, the procedure of manually placing supporting pillars can be omitted, thereby solving the problem of difficult to manually placing support pillars in the manufacturing procedure of the conventional vapor chamber.

In this embodiment, the first cover 100 and the second cover 200 are supported by both the first support protrusion structures 210 and the second support protrusion structures 220, but the present disclosure is not limited thereto. In other embodiments, the first cover and the second cover may be supported only by the first support protrusion structures or only by the second support protrusion structures. That is, the support protrusion structures of the second cover can be only in physical contact with the plate of the first cover or the thermally conductive protrusion structure of the first cover.

In this embodiment, the quantity of the first supporting protrusion structures 210 is plural, and the quantity of the second supporting protrusion structures 220 is plural, but the present disclosure is not limited thereto. In other embodiments, the quantity of the first supporting protrusion structure may be one and the quantity of the second supporting protrusion structure may be one.

In this embodiment, the first supporting protrusion structures 210, the second supporting protrusion structures 220 and the thermally conductive protrusion structure 120 protrude toward a same direction D, but the present disclosure is not limited thereto. In other embodiments, the first supporting protrusion structures and the second supporting protrusion structures may be formed on the first cover such that the protruding directions of the first support protrusion structures and the second support protrusion structures are opposite to the protruding direction of the thermally conductive protrusion structure.

In this embodiment, the first support protrusion structures 210 and the first cover 100 are connected by, for example, welding, and the second support protrusion structures 220 and the first cover 100 are connected by, for example, welding, or the first support protrusion structures 210 and the first cover 100 are attached to each other only by a heating treatment, and the second support protrusion structures 220 and the first cover 100 are attached to each other only by a heating treatment.

In this embodiment, the vapor chamber 10 may further include capillary structures (not shown). The capillary structures can be stacked on one or both of the first cover 100 and the second cover 200. That is, the first cover 100 and the second cover 200 are, for example, welded or attached to the first cover 100 via the capillary structures.

Figure 5:
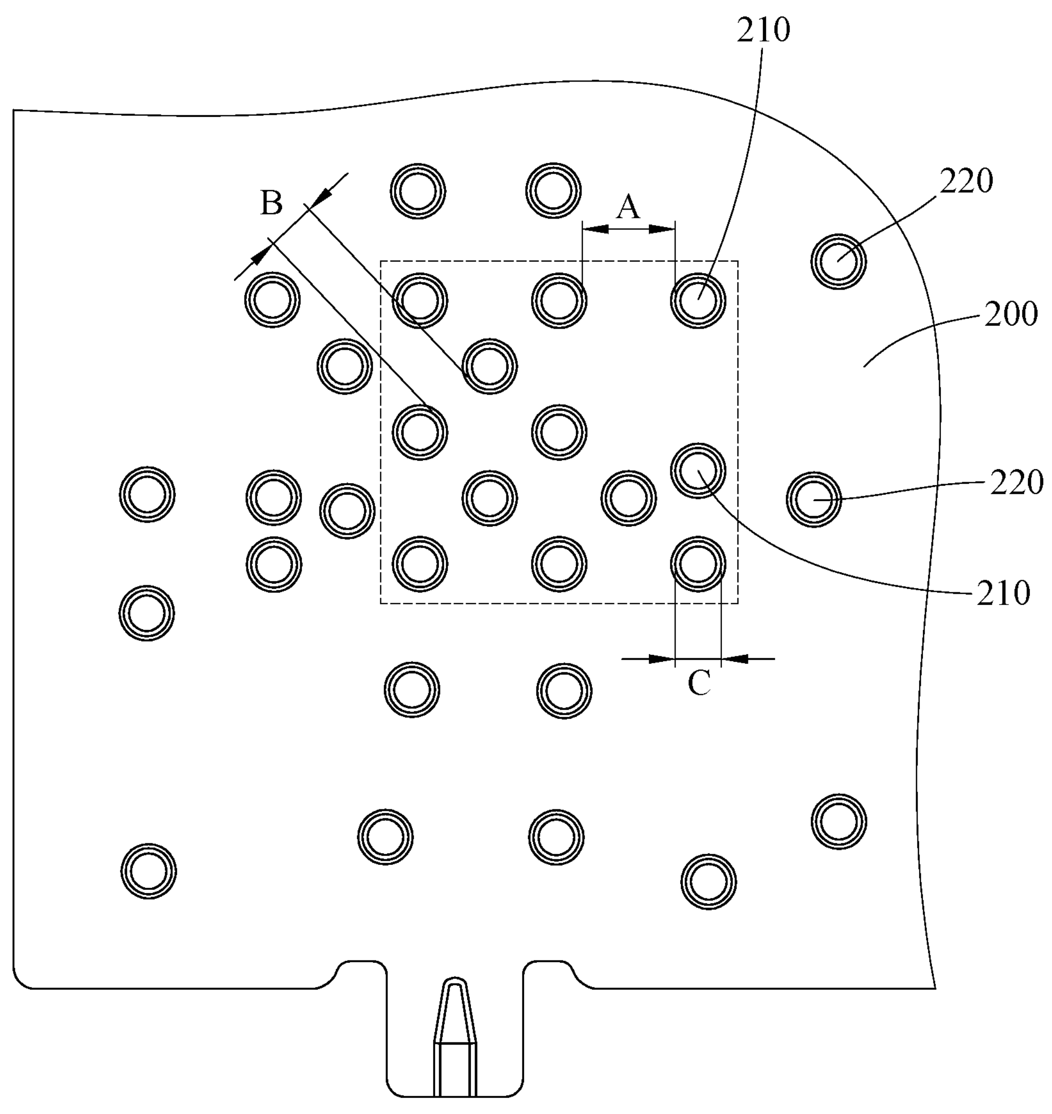
FIG. 5 is a plane view of the second cover in FIG. 2.

Please further refer to FIG. 5, which is a plane view of the second cover 200 in FIG. 2. In this embodiment, the first support protrusion structures 210 are located within the range of the outer contour of the thermally conductive protrusion structure 120 (as shown by the dotted line frame), and a lateral distance A between adjacent two of the first support protrusion structures 210 is, for example, larger than or equal to 0.5 mm and less than or equal to 20 mm. An oblique distance B between adjacent two of the first support protrusion structures 210 is, for example, larger than or equal to 0.5 mm and less than or equal to 20 mm. A lateral distance A between adjacent two of the second support protrusion structures 220 is, for example, larger than or equal to 0.5 mm and less than or equal to 20 mm. An oblique distance B between adjacent two of the second support protrusion structures 220 is, for example, larger than or equal to 0.5 mm and less than or equal to 20 mm.

In this embodiment, diameters C of the first support protrusion structures 210 and the second support protrusion structures 220 are, for example, larger than or equal to 0.25 mm and less than or equal to 25 mm.

Figure 6:
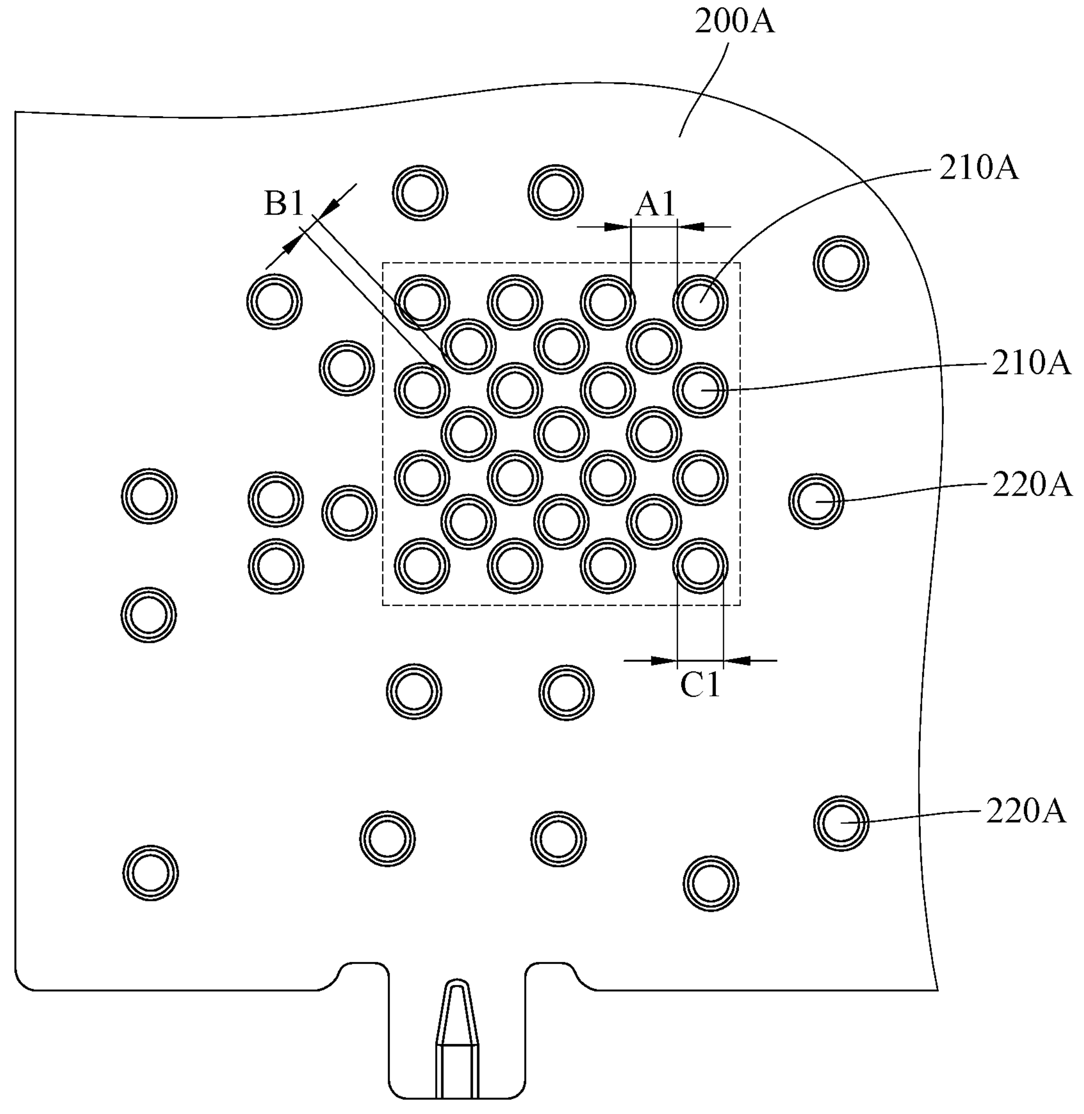
FIG. 6 is a plane view of a second cover in accordance with the second embodiment of the disclosure.

In the above-mentioned embodiment, the first support protrusion structures 210 are irregularly distributed within the range of the outer contour of the thermally conductive protrusion structure 120, but the present disclosure is not limited thereto. Referring to FIG. 6, which is a plane view of a second cover in accordance with the second embodiment of the disclosure. In this embodiment, the second cover 200A is a modification of the second cover 200 of the first embodiment, and the second cover 200A can be configured with the first cover 100 of the first embodiment to form a vapor chamber. The differences between this embodiment and the first embodiment will be described below, and the same parts will not be repeated. The second cover 200A has a plurality of first support protrusion structures 210A and a plurality of second support protrusion structures 220A. The first support protrusion structures 210A are regularly distributed within the range of the outer contour of a thermally conductive protrusion structure 120A. Said "regularly" means that lateral distances A1 between each of all adjacent two first support protrusion structures 210A are the same and, for example, larger than or equal to 0.5 mm and less than or equal to 20 mm, and oblique distances B1 between each of all adjacent two first support protrusion structures 210A are the same and, for example, larger than or equal to 0.5 mm and less than or equal to 20 mm. The second support protrusion structures 220A are distributed outside the outer contour of the thermally conductive protrusion structure 120A. In addition, diameters C1 of the first support protrusion structures 210A are, for example, larger than or equal to 0.25 mm and less than or equal to 25 mm.

According to the vapor chamber as described above, the plurality of first support protrusion structures and the plurality of second support protrusion structures are formed by, for example, a sheet metal stamping process. Therefore, the procedure of manually placing supporting pillars can be omitted, thereby solving the problem of difficult to manually placing support pillars in the manufacturing procedure of the conventional vapor chamber.

In addition, if the distances between each of all adjacent two of the first support protrusion structures are too small, airflow may not be able to smoothly flow in the internal airway due to limited space in the chamber, and if the distances between each of all adjacent two of the first support protrusion structures are too large, the vapor chamber may collapse due to lack of support. Therefore, if the distances between each of all adjacent two of the first support protrusion structures satisfy the above-mentioned definition of the lateral distance and the oblique distance, both the requirements of flow smoothness of internal airflow and structural strength of the vapor chamber can be met.

In addition, if the diameters of the first support protrusion structures are too small, it would be difficult for molding, and if the diameters of the first support protrusion structures are too large, airflow may not be able to smoothly flow in the internal airway. Therefore, if the diameters of the first support protrusion structures satisfy the above-mentioned definition of the diameter, both the requirements of easy manufacturing and flow smoothness of internal airflow can be met.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A vapor chamber, comprising:

a first cover, having a thermal contact surface configured to be thermally coupled to a heat source; and a second cover, wherein the second cover and the first cover are joined together to form an air tight space, the air tight space is configured to accommodate a cooling fluid, and the thermal contact surface faces away from the air tight space;

wherein the second cover has a first surface, a second surface and a plurality of pressed first support protrusion structures extending from the second surface, the first surface faces away from the first cover, the second surface faces the first cover, the pressed first support protrusion structures extend outwardly from the second surface of the second cover towards the heat source that is thermally coupled to the thermal contact surface, the pressed first support protrusion structures are arranged within an outer contour of a thermally conductive protrusion structure of the first cover, and a first subset of the pressed first support protrusion structures disposed along a first boundary side of the outer contour are spaced from one another with substantially equal distances, while a second subset of the pressed first support protrusion structures disposed along a second boundary side of the outer contour opposite the first boundary side are spaced from one another with unequal distances.

2. The vapor chamber according to claim 1, wherein the first cover comprises a plate and a thermally conductive protrusion structure, the thermally conductive protrusion structure protrudes from the plate in a direction away from the air tight space, and the thermal contact surface is located on a side of the thermally conductive protrusion structure located away from the air tight space.

3. The vapor chamber according to claim 2, wherein the first support protrusion structures are in physical contact with the first cover.

4. The vapor chamber according to claim 2, wherein the first support protrusion structures are in physical contact with the thermally conductive protrusion structure.

5. The vapor chamber according to claim 4, wherein the second cover further has at least one second support protrusion structure, the at least one second support protrusion structure protrudes from the second surface of the second cover and is in physical contact with the plate, and a height of at least one of the first support protrusion structures protruding from the second surface is larger than a height of the at least one second support protrusion structure protruding from the second surface.

6. The vapor chamber according to claim 5, wherein a quantity of the at least one second support protrusion structure is plural, and diameters of the first support protrusion structures and the second support protrusion structures are greater than or equal to 0.25 mm and less than or equal to 25 mm.

7. The vapor chamber according to claim 5, wherein a lateral distance between adjacent two of the first support protrusion structures is greater than or equal to 0.5 mm and less than or equal to 20 mm.

8. The vapor chamber according to claim 5, wherein an oblique distance between adjacent two of the first support protrusion structures is greater than or equal to 0.5 mm and less than or equal to 20 mm.

9. The vapor chamber according to claim 5, wherein the height of at least one of the first support protrusion structures protruding from the second surface and the height of the at least one second support protrusion structure protruding from the second surface are less than or equal to 6 times of a thickness of the second cover.

10. The vapor chamber according to claim 5, wherein the height of at least one of the first support protrusion structures protruding from the second surface and the height of the at least one second support protrusion structure protruding from the second surface are larger than or equal to 30% of a thickness of the vapor chamber and less than or equal to 90% of the thickness of the vapor chamber.

11. A vapor chamber, comprising:

a first cover, having a thermally conductive protrusion structure configured to be thermally coupled to a heat source; and a second cover, wherein the second cover and the first cover are joined together to form an air tight space, and the air tight space is configured to accommodate a cooling fluid;

wherein the second cover has a plurality of pressed first support protrusion structures extending from the second cover, the first support protrusion structures and the thermally conductive protrusion structure protrude in a same direction, the pressed first support protrusion structures extend outwardly from the second cover towards the heat source that is thermally coupled to the thermally conductive protrusion structure, the pressed first support protrusion structures are arranged within an outer contour of the thermally conductive protrusion structure, and a first subset of the pressed first support protrusion structures disposed along a first boundary side of the outer contour are spaced from one another with substantially equal distances, while a second subset of the pressed first support protrusion structures disposed along a second boundary side of the outer contour opposite the first boundary side are spaced from one another with unequal distances.

* * * * *